United States Patent [19]

Abou et al.

[11] Patent Number: 4,524,328

[45] Date of Patent: Jun. 18, 1985

[54] MOS POWER AMPLIFIER CIRCUIT

[75] Inventors: Shouji Abou; Itsuo Sasaki, both of Kawasaki, Japan

[73] Assignee: Tokyo Shibaura Denki Kabushiki Kaisha, Japan

[21] Appl. No.: 524,783

[22] Filed: Aug. 19, 1983

[30] Foreign Application Priority Data

Aug. 20, 1982 [JP] Japan .................. 57-144474

[51] Int. Cl.³ .................... H03F 3/45; H03F 3/26
[52] U.S. Cl. .................... 330/253; 330/255; 330/257; 330/269
[58] Field of Search .......... 330/253, 255, 257, 262, 330/264, 265, 269

[56] References Cited

U.S. PATENT DOCUMENTS

| 4,096,398 | 6/1978 | Khaitan | 330/269 X |
| 4,241,313 | 12/1980 | Takehara | 330/253 |
| 4,355,287 | 10/1982 | Hoover | 330/264 |

FOREIGN PATENT DOCUMENTS 53-94165 1/1977 Japan.

*Primary Examiner*—James B. Mullins
*Assistant Examiner*—Steven J. Mottola
*Attorney, Agent, or Firm*—Finnegan, Henderson, Farabow, Garrett & Dunner

[57] ABSTRACT

A MOS power amplifier circuit comprised of a load driver including two p-channel MOSFETs connected in series, a preamplifier for amplifying an analog input signal and supplying the amplified one to the gate of one of the MOSFETs and for rendering the impedance of the two MOSFETs low; and an inverting amplifier for invert-amplifying the output signal from the preamplifier and supplying the amplified one to the gate of the other MOSFET. The operating voltage of the preamplifier and the inverting amplifier is higher than that of the load driver.

4 Claims, 15 Drawing Figures

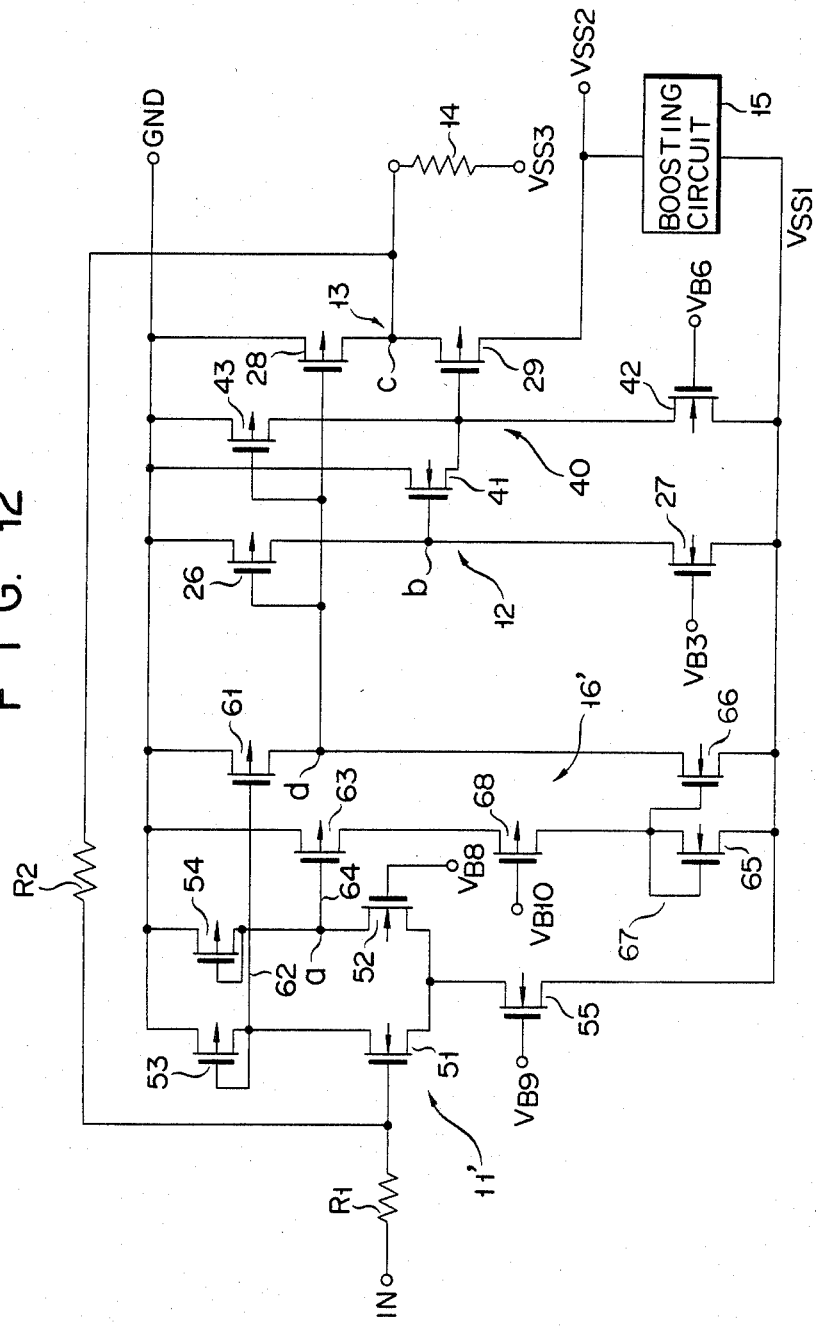
F I G. 12

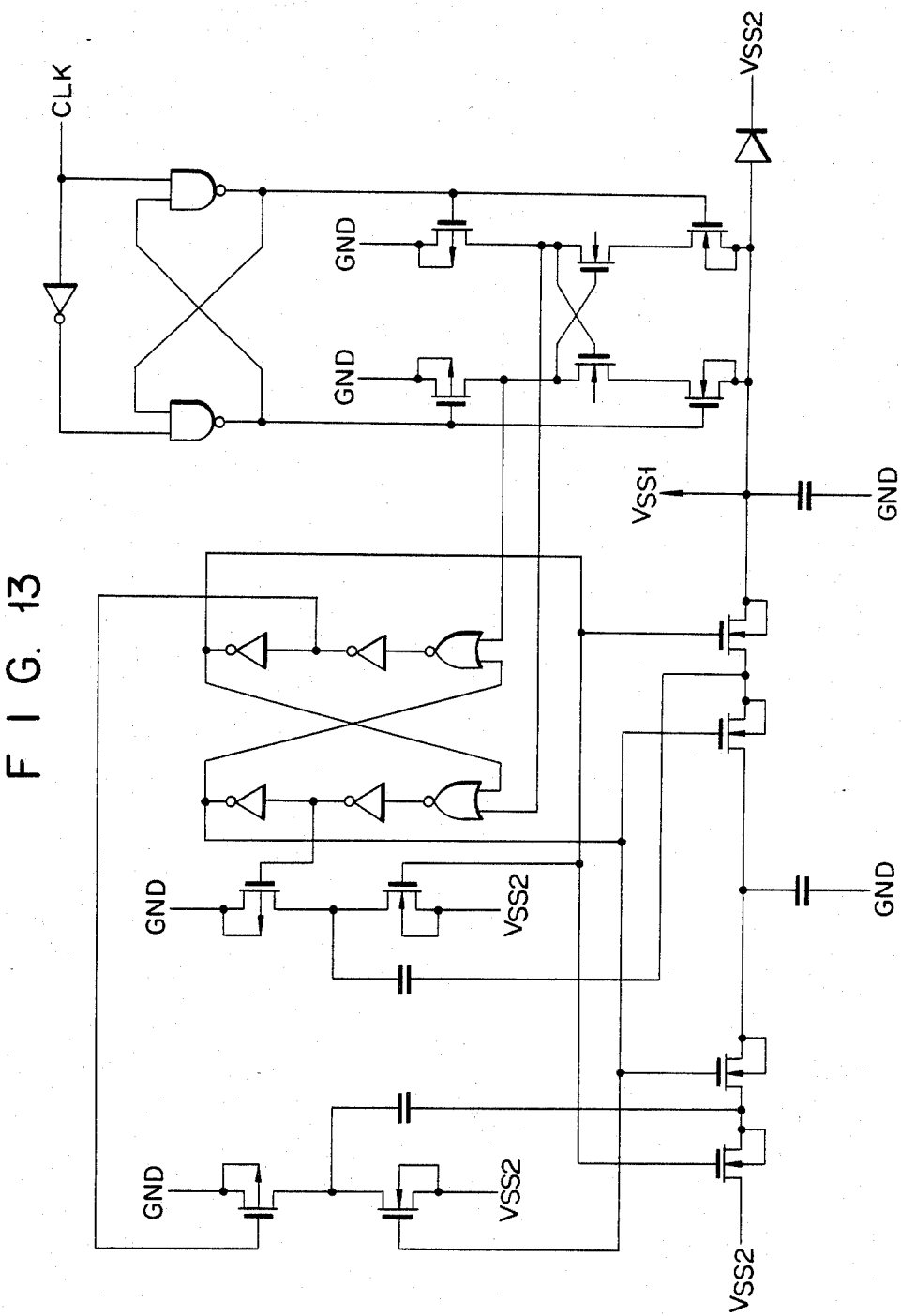
F I G. 13

F I G. 15
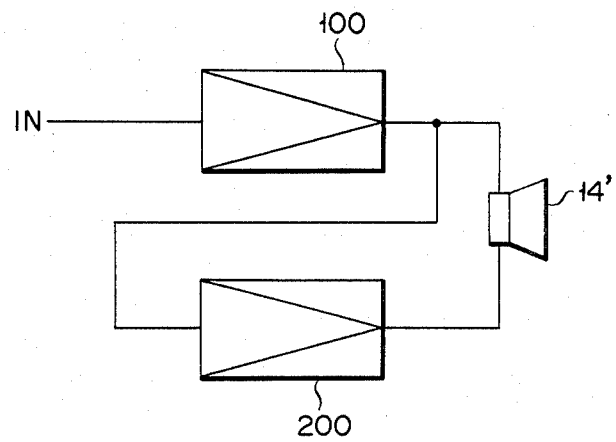

MOS POWER AMPLIFIER CIRCUIT

BACKGROUND OF THE INVENTION

This invention relates to a MOS power amplifier circuit constructed with MOSFETs, and more particularly to a MOS power amplifier circuit capable of producing a sufficiently large output current.

Prior art includes a MOS power amplifier circuit with two MOSFETs of the same channel type and connected in series, provided at the output stage of the amplifier. One of the MOSFETs receives an input signal at the gate and the other an inverted input signal at the gate, with the result that the two MOSFETs are driven in a push-pull manner. In this prior amplifier circuit, however, if the amplitudes of the signals applied to the two MOSFETs are too small, the on-resistance of each of the two MOSFETs is unsatisfactorily decreased, resulting in an insufficient output current.

SUMMARY OF THE INVENTION

Accordingly, an object of the present invention is to provide a MOS power amplifier circuit capable of producing a sufficiently large output current.

The present invention provides a MOS power amplifier circuit comprising: load drive means composed of a pair of MOSFETs of the same channel type and connected in series between a pair of nodes, supplied with different potentials; a load connected between a node in the series connection of the MOSFETs and a point for applying a predetermined potential; preamplifier means whose operation voltage is higher than the potential difference between said MOSFETs and which produces an output signal for transmission to the gate of one of the MOSFETs; and inverting amplifier means whose operation voltage is higher than the potential difference between said MOSFETs and which invertamplifies the output signal from the preamplifier means and applying the amplified one to the gate of the other MOSFET.

BRIEF DESCRIPTION OF THE DRAWINGS

FIGS. 2 through 12 show circuit diagrams of MOS power amplifier circuits which are other embodiments of the present invention;

FIG. 13 shows a circuit diagram of a boosting circuit used in the circuits of FIGS. 2 through 12;

FIG. 15 is a block diagram of the circuit of FIGS. 14A and 14B.

DETAILED DESCRIPTION OF THE PREFERRED EMBODIMENTS

Figure 1:
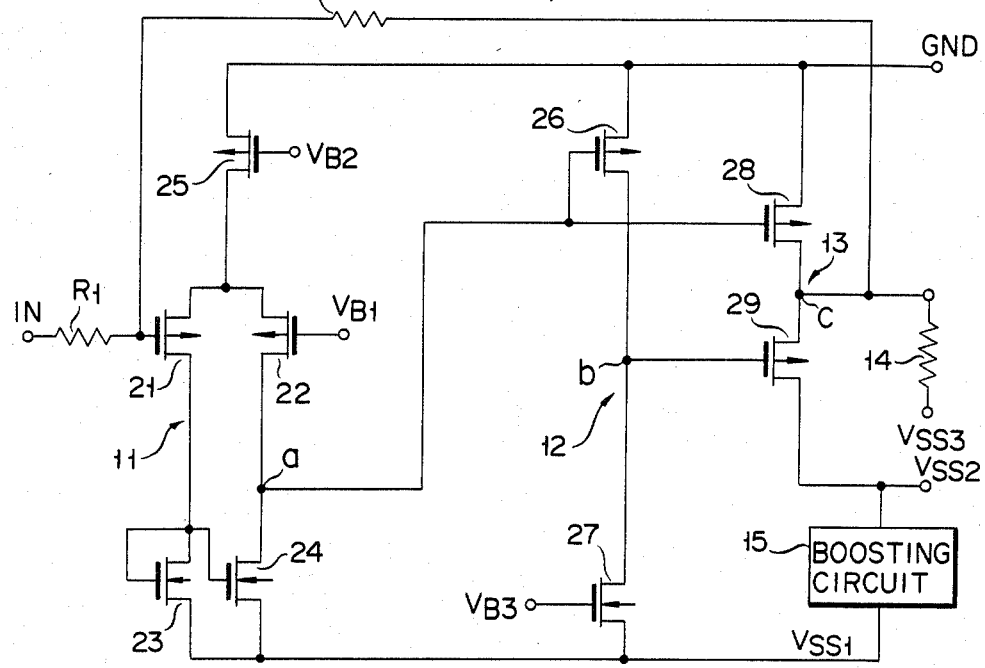
FIG. 1 shows a circuit diagram of a MOS power amplifier circuit which is an embodiment of the present invention.

An embodiment of the present invention will be described referring to the accompanying drawings. FIG. 1 shows a MOS power amplifier circuit which is an embodiment according to the present invention. The MOS power amplifier circuit is comprised of a preamplifier 11 for amplifying an analog input signal IN, an inverting amplifier 12 for inverting and amplifying the output signal of the preamplifier 11, a push-pull amplifier 13 provided at the output stage, and a load 14.

The preamplifier 11 includes a pair of p-channel MOSFETs 21 and 22 forming a differential amplifier, a pair of n-channel MOSFETs 23 and 24 for a load, and a p-channel MOSFET 25 for a current source. The MOSFET 21 as one of the MOSFETs forming the differential amplifier receives at the gate an analog signal IN through a resistor R1. The other MOSFET 22 receives at the gate a predetermined bias potential $V_{B1}$. A reference potential GND is supplied to the source of the MOSFET 25 for a current source, and a bias potential $V_{B2}$ to the gate of the same. Of the load MOSFETs 23 and 24, the MOSFET 23 is connected at the drain to the drain of the MOSFET 21, at the source to a node supplied with a negative potential $V_{SS1}$, and at the gate to the drain of the MOSFET 23 per se. The load MOSFET 24 is connected at the drain to the drain of the MOSFET 22, at the source to the potential $V_{SS1}$, and at the gate to the gate of the MOSFET 23. The preamplifier 11 is a differential amplifier which amplifies the analog input signal IN with a reference potential of the bias potential $V_{B1}$, and produces a potential according to the analog input signal potential at a node a as a common drain connection point between the MOSFETs 22 and 24.

The inverting amplifier 12 includes a p-channel MOSFET 26 connected at the source to the node supplied with the reference potential GND, and an n-channel MOSFET 27 which is connected at the drain to the drain of the MOSFET 26 and at the source to the node from which the potential $V_{SS1}$ is supplied. The potential at the node a is supplied to the gate of the MOSFET 26 and a predetermined bias potential $V_{B3}$ is supplied to the gate of the MOSFET 27. The inverting amplifier 12 is an inverter of the CMOS type in which the MOSFET 27 is used as a load MOSFET and the MOSFET 26 and a drive MOSFET. An inverting potential given by the potential at the node a is derived from a node b as a common drain connection node between the MOSFETs 26 and 27.

The push-pull amplifier 13 includes a p-channel MOSFET 28 connected at the source to the node from which the reference potential GND is supplied, and a p-channel MOSFET 29 connected at the source to the drain of the MOSFET 28 and at the drain to the node from which the negative potential $V_{SS2}$ is supplied. The potential at the node a is supplied to the gate of the MOSFET 28 and the potential at the node b is supplied to the gate of the MOSFET 29. The load 14 is connected at one end to the node c as a connection point between the drain of the MOSFET 28 and the source of the MOSFET 29. The other end of the load 14 is connected to the node from which the negative potential $V_{SS3}$ is supplied. In addition to the resistor R1, a resistor R2 for determining any gain of the overall circuit is inserted between the node c and the gate of the MOSFET 21.

The potential, externally applied when the circuit of this embodiment is fabricated into an integrated circuit, is only the reference potential GND of 0 V and the potential $V_{SS2}$, of $-3$ V, for example. The potential $V_{SS3}$ supplied to the other end of the load 14 is formed by dividing the potential $V_{SS2}$, and its value is $-1.5$ V. The potential $V_{SS1}$ is set at $-9$ V, for example, by the boosting circuit 15 provided between the node from which the potential $V_{SS2}$ is supplied and the node from which the potential $V_{SS1}$ is supplied. The potential $V_{SS2}$ is boosted three times. The bias potential $V_{B1}$ is formed using the external potential $V_{SS2}$ and set at $-1.5$ V. The remaining two bias potentials $V_{B2}$ and $V_{B3}$ are also set at values so as to cause proper currents to flow through the MOSFETs 25 and 27. The DC bias voltage of the analog input IN is set at $-1.5$ V.

The operation of the circuit thus arranged will be described. In the case where there is no analog input signal, viz. the potential of the analog input signal IN is fixed at $-1.5$ V, the potential at the node c is set at $-1.5$ V. The other end of the load 14 is always kept at $-1.5$ V with the potential $V_{SS3}$. Under this condition, no current flows into the load 14 and hence the load 14 is not driven.

The preamplifier 11 amplifies a change in the potential of the analog input signal IN relative to the DC potential of $-1.5$ V. The potential Va at the node a relative to the potential GND changes in the same direction as the potential of the analog input signal IN does. In an input condition of the circuit where the absolute value $|Va|$ of the potential Va at the node a much exceeds the absolute value $|Vthp|$ of the threshold voltage Vthp of the p-channel MOSFET 26, $|Va| > |Vthp|$, the p-channel MOSFET 26 in the inverting amplifier 12 turns on. When the MOSFET 26 starts, the potential Vb at the node b is almost 0 V, and the p-channel MOSFET 29 in the push-pull amplifier 13 turns off. The MOSFET 28 in the push-pull amplifier 13, which is supplied at the gate with the potential Va at the node a, has its conduction controlled through the potential Va with its drain-source impedance changed according to this potential Va. In this case, the load 14 is fed with a current corresponding to the potential of the analog input signal IN at that time, through the MOSFET 28.

When the potential of the analog input signal IN changes in the reverse direction as that mentioned above, and the absolute value $|Va|$ of the potential Va slightly exceeds the absolute value $|Vthp|$ of the threshold voltage Vthp, $|Va| = |Vthp + \alpha|$, a slight change of the potential Va causes the potential Vb at the node b to vary in the range from 0 V to $V_{SS1}$. At this time, the MOSFET 29 in the push-pull amplifier 13, which receives at the gate the potential Vb at the node b, has its conduction controlled through the potential Vb. The impedance between the source and drain of the MOSFET 29 is set at a value as defined by the potential Vb. In this case, the load 14 is supplied, via the MOSFET 29, with a current as given by the potential of the analog input signal IN at that time. At this time, the impedance between the source and drain of the MOSFET 28 in the push-pull amplifier 13 changes according to the potential of the analog input signal IN and the current determined by the impedance flows through the MOSFET 28. This current is determined by a geometrical ratio of the MOSFETs 28 and 26 and the value of the current flowing through the MOSFET 27. Therefore, this current can be made satisfactorily small by properly selecting the ratio and the current of the MOSFET 27.

In the present embodiment, the gate input potentials Va and Vb of the two MOSFETs 28 and 29, which constitute the push-pull amplifier 13, are obtained from the preamplifier 11 operating between the potential $V_{SS1}$ larger than the potential $V_{SS2}$ and the reference potential GND, and from the inverting amplifier 12. Therefore, these potentials obtained are satisfactorily large. This implies that the impedance between the source and drain of the two MOSFETs 28 and 29 in the push-pull amplifier 13 could be reduced to a satisfactorily small value, and that a satisfactorily large load current is allowed to flow into the load 14. When the potential $V_{SS2}$ of $-3$ V is directly used as the potential $V_{SS1}$, the gate-source voltage of the MOSFET 28 is 3 V at maximum. When the potential $V_{SS2}$ of $-3$ V is boosted three times to $-9$ V, as in the circuit of the present embodiment, the gate-source voltage of the MOSFET 28 is 9 V at maximum.

The on-resistance $R_{ONP}$ (source-drain impedance) of the p-channel MOSFET is generally expressed by $$R_{ONP} = \frac{1}{\frac{1}{2} \cdot \frac{W}{L} \cdot Cox \cdot \mu P \cdot (V_{GS} - Vthp)} \quad (1)$$

where
W : Channel width
L : Channel length
Cox: Capacitance of the gate insulating film
$\mu P$ : Hole mobility
$V_{GS}$: Gate-source voltage
Vthp: Threshold voltage.

If the Vthp is 1 V, the value $R_{ONP1}$ of the $R_{ONP}$ when the $V_{SS1}$ is set at $-3$ V, is given $$R_{ONP1} = \frac{1}{\frac{1}{2} \cdot \frac{W}{L} \cdot Cox \cdot \mu P \cdot (3 - 1)} \quad (2)$$

when the $V_{SS1}$ is $-9$ V, the $R_{ONP2}$ is $$R_{ONP2} = \frac{1}{\frac{1}{2} \cdot \frac{W}{L} \cdot Cox \cdot \mu P \cdot (9 - 1)} \quad (3)$$

As seen from the equations (2) and (3), the on-resistance of the MOSFET 28 when the $V_{SS1}$ is boosted up to $-9$ V can be reduced ¼ that when it is set at $-3$ V. By boosting the $V_{SS1}$ above the $V_{SS2}$, the current drive performance for the load 14 of the MOSFET 28 can be enhanced.

The MOSFET 29 has such problems as the adverse influence of the back-gate effect, inequality of the gate-source voltage to the absolute value $|Vb|$, etc. For this reason, the on-resistance of the MOSFET 29 can not be treated like that of the MOSFET 28. Note here that the on-resistance of the MOSFET 29 when the $V_{SS1}$ is set at $-9$ V can be set at a smaller figure. Accordingly, the current drive ability for the load 14 of the MOSFET 29 would be enhanced.

This embodiment is the MOS power amplifier circuit of the inverting type in which, as the potential of the analog input signal IN approaches from the DC bias voltage $-1.5$ V toward 0 V, the potential at the node c approaches to the $V_{SS1}$, $-3$ V. The gain of this amplifier is determined by a resistance ratio of the resistors R1 and R2, $-R2/R1$.

Figure 2:
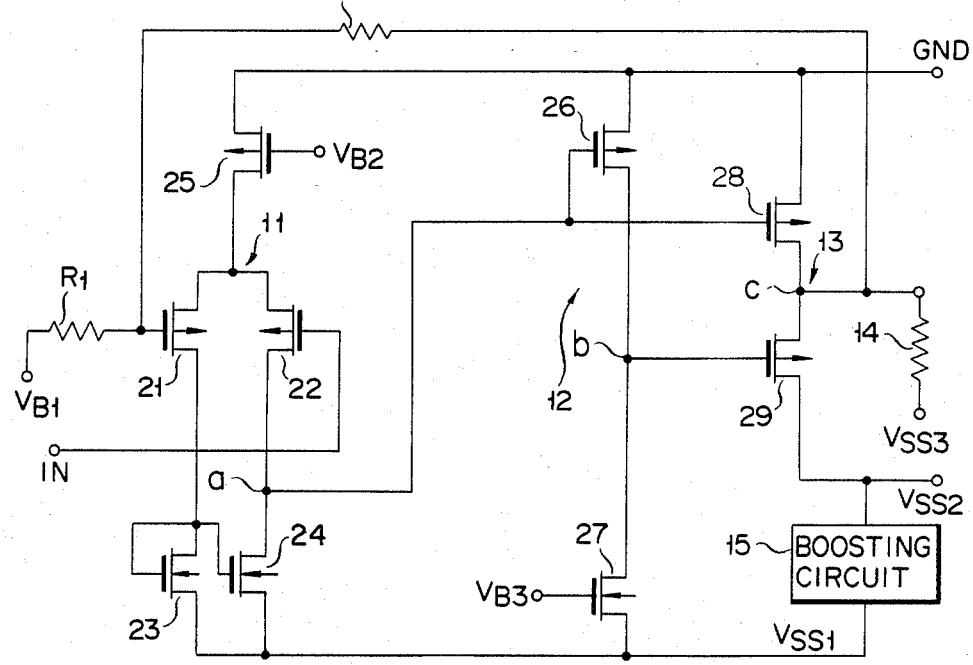

Turning now to FIG. 2, a MOS power amplifier circuit is shown which is an embodiment according to the present invention. While the above embodiment is of the inverting amplifier type, this embodiment is of a positive phase sequence type with the following characteristics. In this embodiment, the analog input signal IN is applied to the gate of the MOSFET 22 in the preamplifier 11 and the bias potential $V_{B1}$ to the gate of the other MOSFET 21, through the resistor R1. The gain of the amplifier of this embodiment is (R1+R2)/R1.

Assume now that the embodiments of FIGS. 1 and 2 are so designed to stably operate when the threshold voltage Vthp of each of the p-channel MOSFETs is at 1 V, for example. On this assumption, the potential Va at the node a is allowed to take a voltage in the range between −9 V and −0.5 V which is the potential Vthp (1 V) higher than the bias potential $V_{B1}$ (−1.5 V). Since the threshold voltage Vthp is 1 V, the MOSFET 26 could be on-off controlled in accordance with the potential Va at the node a. If the threshold voltage Vthp of each of the p-channel MOSFETs deviates from the design value and is 0.5 V, the potential Va at the node a is reduced up to −1 V at most. The MOSFET 26 is not turned off and is always kept in an ON-state and, hence, the MOSFET 29 is kept in an OFF-state. Under this condition, the MOS power amplifier circuit operates abnormally.

Figure 3:
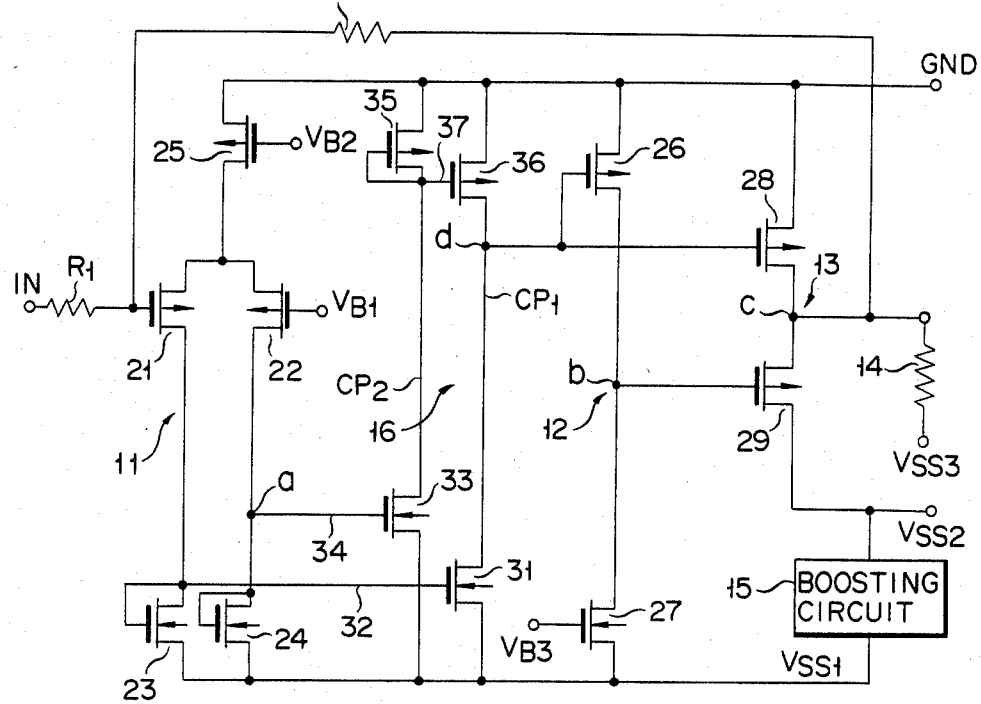

FIG. 3 shows another embodiment of a MOS power amplifier circuit according to the present invention. This embodiment features a level changing section 16 at the output side of the preamplifier 11 in the circuit of FIG. 1. The level changing section 16 changes the potential Va at the node a to a potential between the reference potential GND and the potential $V_{SS1}$. The level changing section 16 eliminates the disadvantage resulting from the deviation of the threshold voltage from the design value of the MOSFET. As shown, the gate of the load MOSFET 24 in the preamplifier 11 is connected to the gate of the MOSFET 24 per se, not to the gate of the MOSFET 23. An n-channel MOSFET 31 is connected at the gate to the gate of the MOSFET 23, at the drain to a current path CP1, and at the source to the node from which the potential $V_{SS1}$ is supplied. The MOSFET 31, in cooperation with the MOSFET 23, constitutes a current mirror circuit 32. With this current mirror circuit 32, a current equal to the current flowing into the MOSFET 23 is allowed to flow out through the current path CP1. The gate of an n-channel MOSFET 33 is connected to the gate of the MOSFET 24. The MOSFET 33 is connected at the drain to one current path CP2 and at the source to the node from which $V_{SS1}$ is supplied. The MOSFETs 33 and 24 constitute a current mirror circuit 34. With this current mirror circuit 34, a current equal to the current flowing into the MOSFET 24 flows out through the current path CP2. The current path CP2 is connected to the drain and gate of the p-channel MOSFET 35. The source of the MOSFET 35 is connected to the node from which the reference potential GND is supplied. The current path CP1 is connected to the drain of the p-channel MOSFET 36. The MOSFET 36 is connected at the gate to the gate of the MOSFET 35, and at the source to the node from which potential GND is supplied. Both MOSFETs 35 and 36 constitute a current mirror circuit 37. With the current mirror circuit 37, a current equal to the current which is made to flow out through the current path CP2 by the current mirror circuit 34 flows into the current path CP1. The gate of the MOSFET 26 in the inverting amplifier 12 and the gate of the MOSFET 28 in the push-pull drive circuit 13 are connected to the node d on the current path CP1.

With such an arrangement, a current transmission ratio for each of the current mirror circuits 32, 34 and, 37 is set at 1:1. Under this current transmission ratio, the current flowing out through the current path CP1 is equal to that flowing into the MOSFET 23. The current made to flow out through the current path CP2 by the MOSFET 33 is equal to the current flowing into the MOSFET 24. The current made to flow into the current path CP1 by the MOSFET 36 is equal to the current flowing out through the current path CP2. As a result, the input/output state of the current at the node d of the level changing section 16 is almost equal to that at the node a in each of the circuits of FIGS. 1 and 2. The level changing section 16 operates between the potentials GND and $V_{SS1}$. The amplitude of the potential Va at the node a is changed to the range between the potentials GND and $V_{SS2}$. Therefore, if the threshold voltage Vthp at each p-channel MOSFET deviates from a design value and the amplitude range of the potential Va at the node a is between −1 V and −9 V, the potential amplitude is level-changed into the range between approximately 0 V and −9 V by the level changing section 16. When the threshold voltage Vthp of each of the p-channel MOSFETs deviates from the design value and the amplitude range of the potential Va at the node a changes from −1 V to −9 V, this potential amplitude is changed into a voltage between 0 V and −9 V by the level changing section 16. In this case, the MOSFET 26 normally operates while not in an ON-state.

Figure 4:
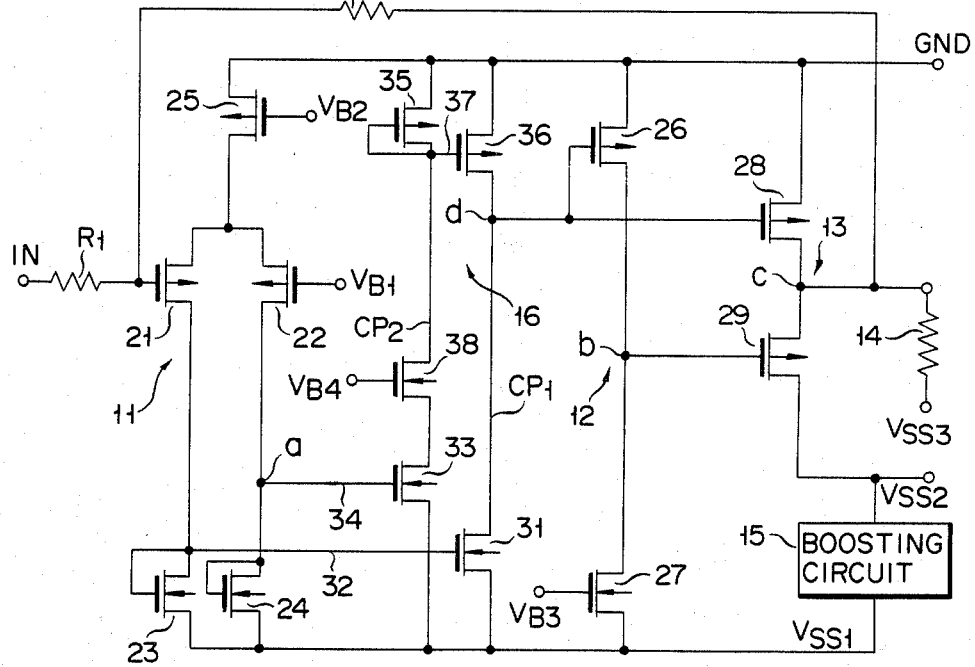

FIG. 4 shows a MOSFET power amplifier circuit according to another embodiment of the present invention. In the embodiment of FIG. 3, when a voltage difference appears between the source-drain paths of the MOSFET pairs 31 and 33 or 35 and 36, an offset voltage appears at the node c. To be more specific, when the input analog signal IN is absent, and the potential of the signal IN is −1.5 V, the current flowing out through the current path CP1 should be equal to the current flowing into the current path CP2. When a drain-source voltage difference occurs, the currents become unequal, so that offset voltage is produced. This embodiment is so designed that when the drain-source voltage of the MOSFET 33 is larger than that of the MOSFET 31, the drain-source path of the n-channel MOSFET 38 supplied with a predetermined gate bias potential $V_{B4}$ is inserted between the MOSFETs 33 and 35. With addition of the MOSFET 38, the drain-source voltage of the MOSFET 33 is set at a potential determined by subtracting the threshold voltage of the MOSFET 38 from the bias potential $V_{B4}$. Accordingly, by adjusting the bias potential $V_{B4}$, the drain-source voltage of the MOSFET 33 may be made to be equal to that of the MOSFET 31. As a result, there is eliminated the offset voltage arising from the drain-source voltage difference between the MOSFETs 31 and 33.

Figure 5:
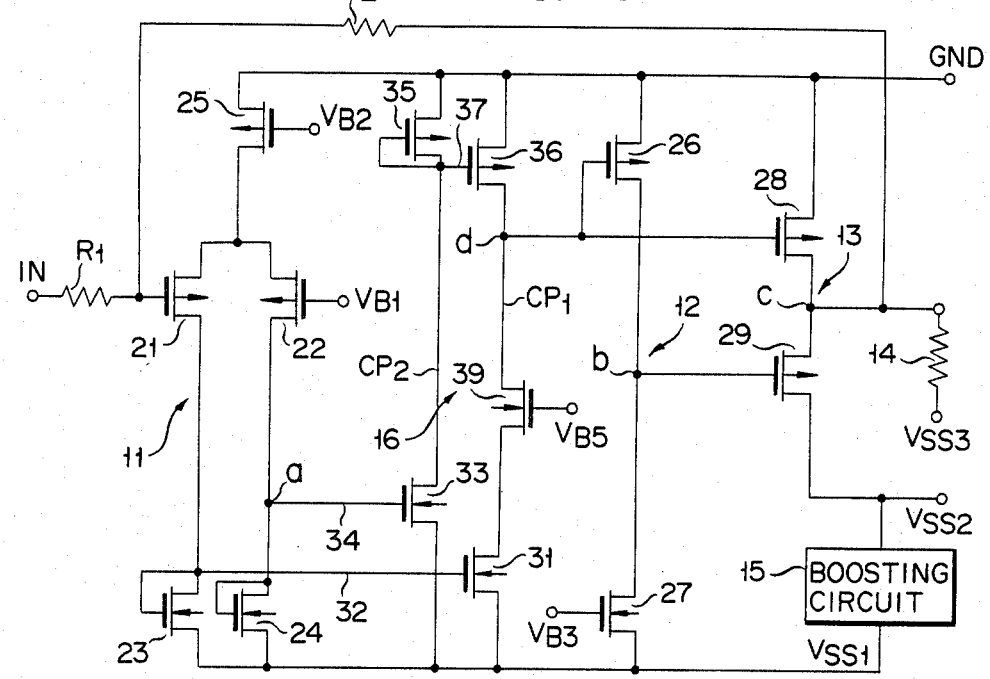

FIG. 5 shows a MOS power amplifier circuit according to another embodiment of the present invention. Unlike the circuit of FIG. 4, this embodiment is so designed as to prevent the generation of the offset voltage when the drain-source voltage of the MOSFET 31 is larger than that of the MOSFET 33. To this end, inserted between the MOSFETs 36 and 31 is the drain-source path of an n-channel MOSFET 39 supplied at the gate with a predetermined gate bias potential $V_{B5}$. Also in this case, by adjusting the bias potential $V_{B5}$, the source-drain voltage of the MOSFET 31 is made to be equal to that of the MOSFET 33.

Figure 6:
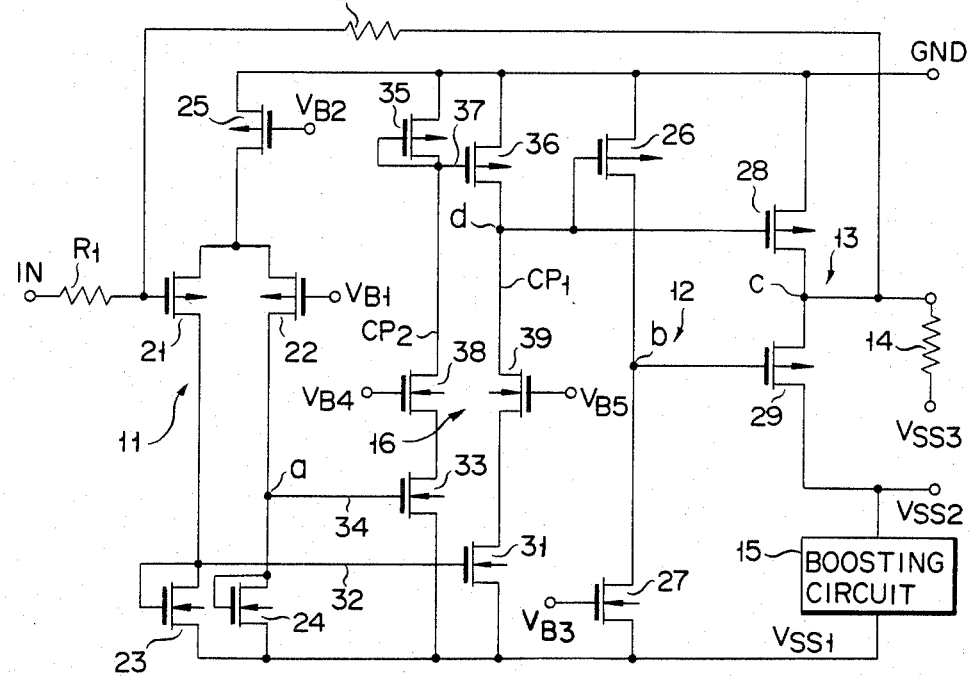

FIG. 6 shows a MOS power amplifier circuit according to yet another embodiment of the present invention. In the present embodiment, both the MOSFETs 38 and 39 are used in the embodiment of FIG. 3, in order to prevent the production of the offset voltage.

Figure 7:
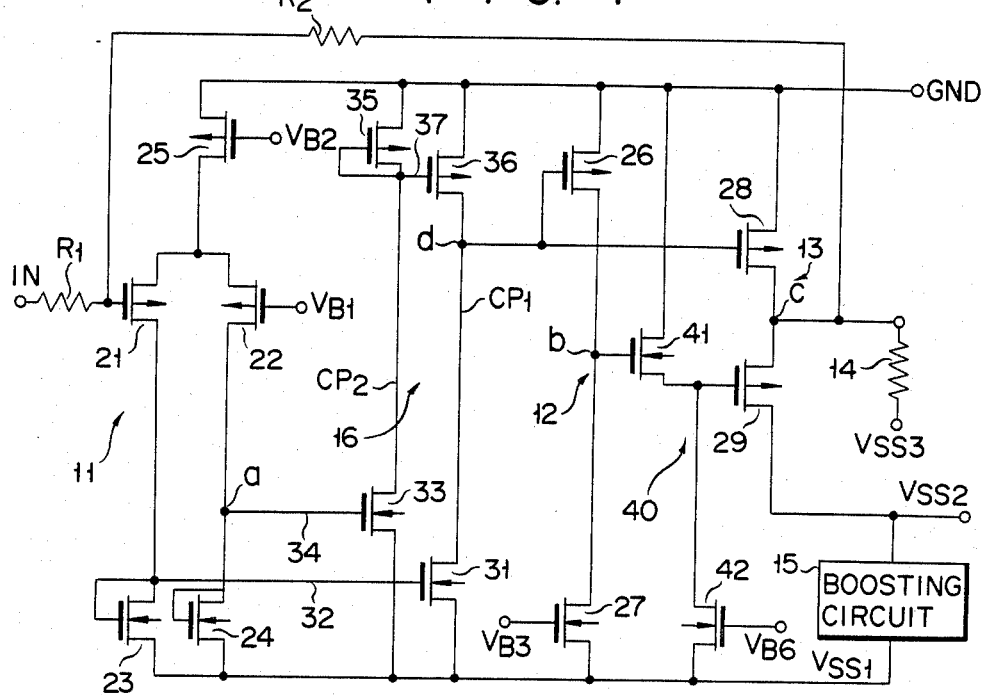

Turning now to FIG. 7, a MOS power amplifier circuit is shown according to a further embodiment of the present invention. In this embodiment, a source follower circuit 40 composed of n-channel MOSFETs 41 and 42 is used in the circuit of FIG. 3, the potential Vb at the node b is applied to the source follower circuit 40 to render its circuit impedance low, and the MOSFET 29 is driven by the output from the circuit 40. A predetermined bias potential $V_{B6}$ is supplied to the gate of a MOSFET 42 and is used as a source load for the MOSFET 41.

Figure 8:
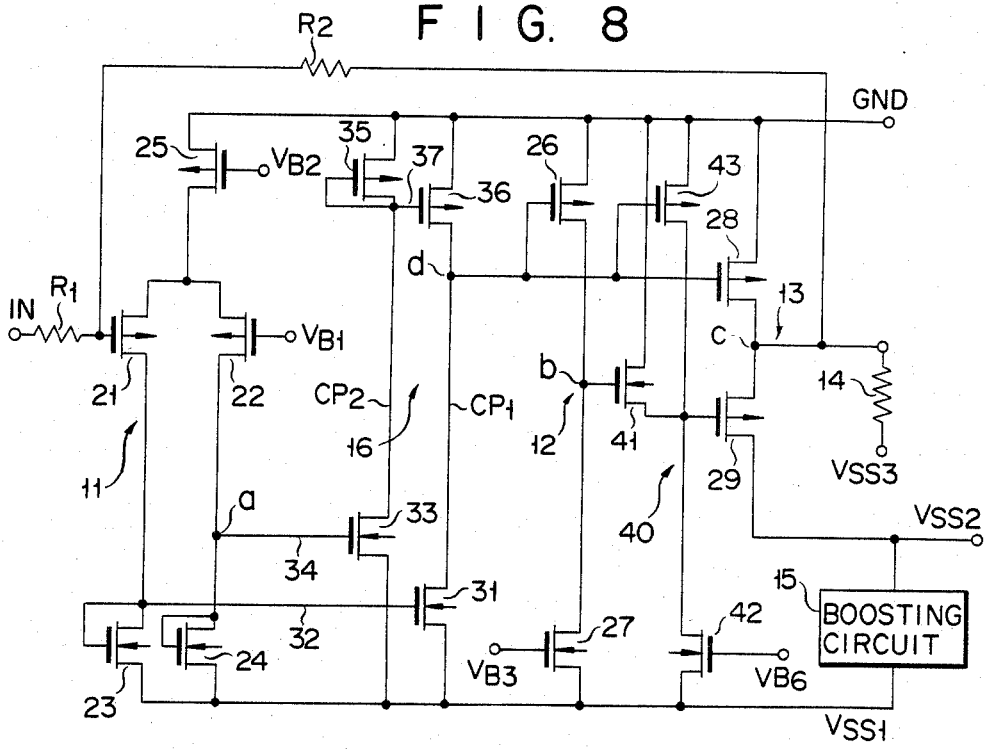

FIG. 8 shows a MOS power amplifier circuit according to another embodiment of the present invention. In the embodiment of FIG. 7, with the addition of the source follower circuit 40, at the potential on the node d causing the MOSFET 28 to turn on, the presence of the MOSFET 41 often causes the gate potential of the MOSFET 29 to be above the threshold voltage Vthp of the MOSFET 29. At this time, the MOSFET 29 turns on, so that the MOSFETs 28 and 29 are simultaneously turned on. To prevent this, a p-channel MOSFET 43 supplied at the gate with the potential at the node d is inserted between the gate of the MOSFET 29 and the reference potential GND. With such an arrangement, when the MOSFET 28 is turned on, the MOSFET 43 also turns on and the gate potential of the MOSFET 29 is set at about reference potential 0 V. At this time, the MOSFET 29 turns off.

Figure 9:
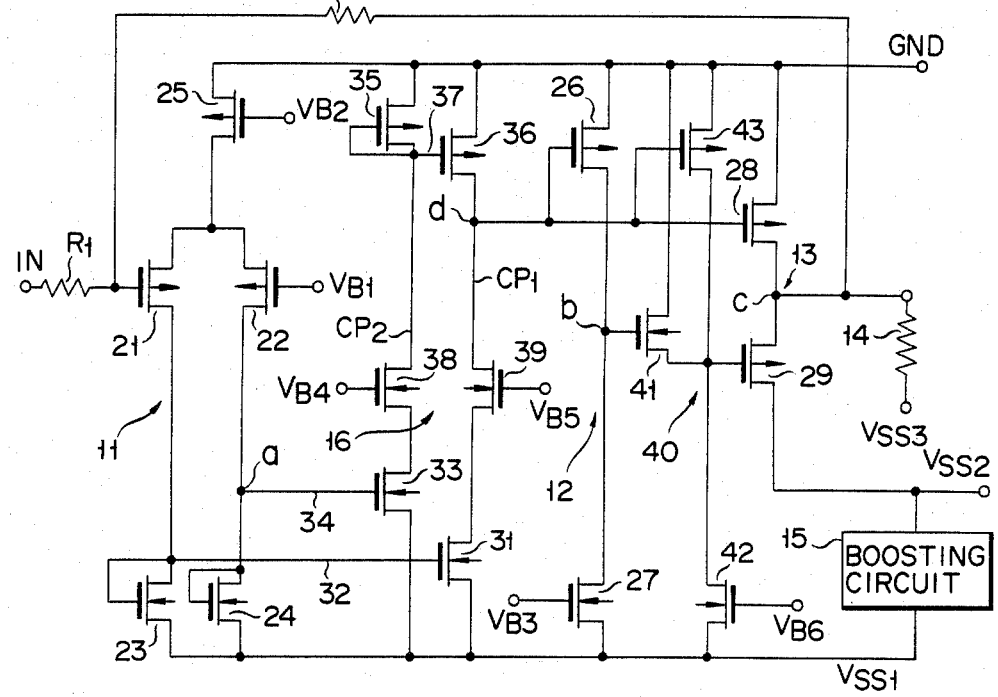

FIG. 9 shows another embodiment of a MOS power amplifier circuit according to the present invention. In the present embodiment, a couple of MOSFETs 38 and 39 for offset voltage prevention are used in the embodiment FIG. 8.

Figure 10:
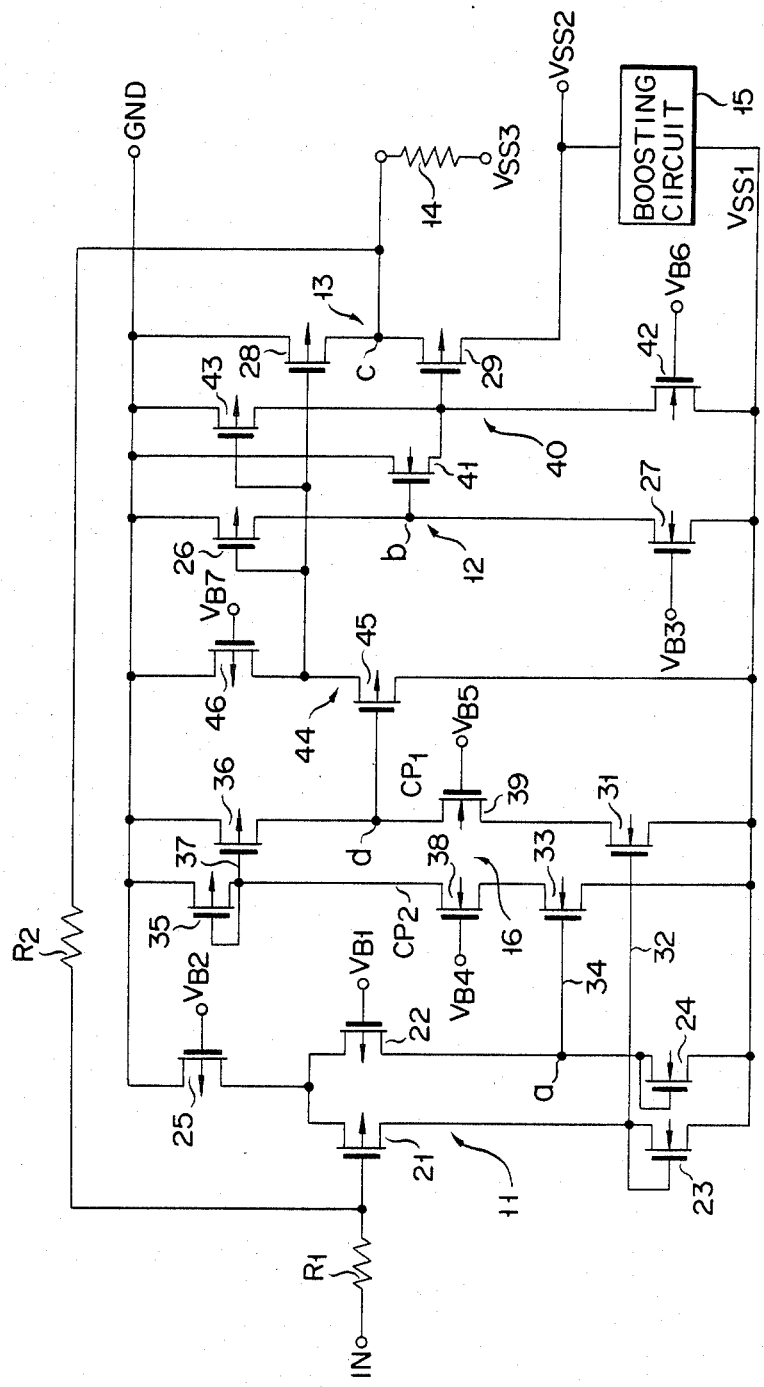

FIG. 10 shows a MOS power amplifier circuit which is another embodiment of the present invention. A source follower circuit 44 composed of p-channel MOSFETs 45 and 46 added to the circuit of FIG. 9. The potential at the node d is applied to the source follower circuit 44 to render the circuit low in impedance and hence to drive the MOSFETs 26, 28 and 43. A predetermined bias potential $V_{B7}$ is applied to the gate of a MOSFET 46 used as a source load of the MOSFET 45.

In the embodiments of FIGS. 2 through 10, the input potential Va to the gate of the MOSFET 28 making up the push-pull amplifier 13 or the potential Vd at the node d, and the potential Vb are obtained from the preamplifier 11 and the inverting amplifier 12, both of which operate between the potential $V_{SS1}$ with an absolute value larger than the potential $V_{SS2}$ and the reference potential GND. Therefore, these values can be made satisfactorily large. As a result, a sufficient load current can be caused to flow into the load 14 for the reasons as mentioned above.

Figure 11:
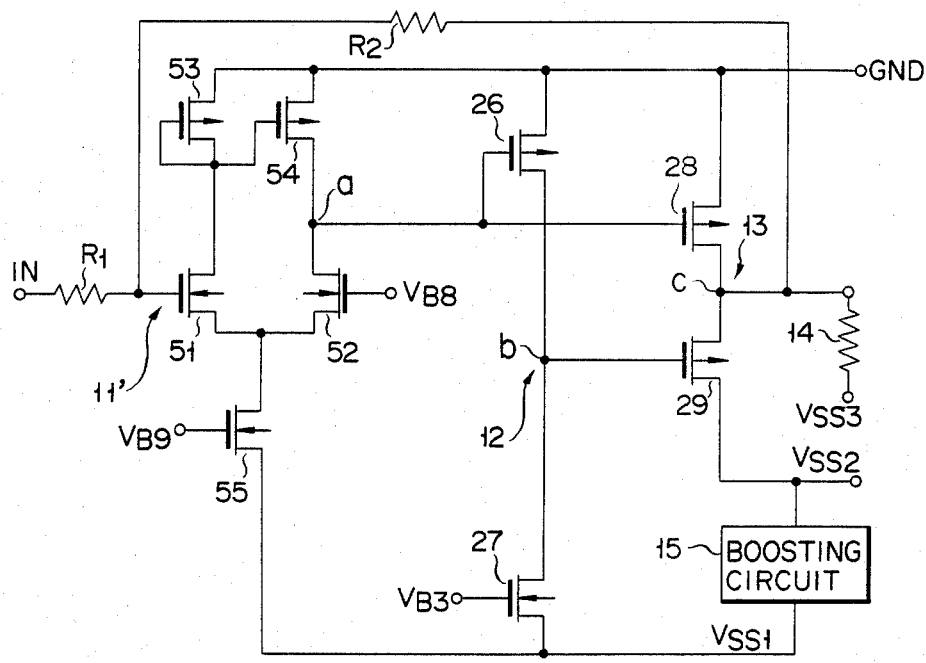

FIG. 11 shows a MOS power amplifier circuit of another embodiment of the present invention. In the embodiment of FIG. 1, a couple of p-channel MOSFETs 21 and 22 are used to form a differential amplifier. This embodiment uses a pair of n-channel MOSFETs 51 and 52 to form the differential amplifier. A preamplifier 11' containing the differential amplifier made up of the MOSFETs 51 and 52, the two load n-channel MOSFETs 23 and 24 are replaced by p-channel MOSFETs 53 and 54, and the p-channel MOSFET 25 for current source is replaced by an n-channel MOSFET 55. A predetermined bias potential $V_{B8}$ is supplied to the gate of the MOSFET 52 in the differential amplifier, and a predetermined bias potential $V_{B9}$ is supplied to the gate of the MOSFET 55 for current source.

The embodiment of FIG. 11 in which the differential amplifier is made up of the two n-channel MOSFETs 51 and 52 may be modified as in the embodiments of FIGS. 3 to 10. For example, the embodiment of FIG. 12 corresponds to the embodiment of FIG. 11 which is modified as in the embodiments of FIGS. 4 and 8. In this case, in the level changing section 16', p-channel MOSFETs 61, 63 and 68 are used in place of the n-channel MOSFETs 31, 33 and 38, and n-channel MOSFETs 65 and 66 are used in place of the p-channel MOSFETs 35 and 36. Both MOSFETs 61 and 53 constitute a current mirror circuit 62. Both MOSFETs 63 and 54 constitute a current mirror circuit 64. Both MOSFETs 65 and 66 constitute a current mirror circuit 67.

FIG. 13 shows a practical arrangement of the boosting circuit 15 for obtaining the potential $V_{SS1}$ of $-9$ V. This boosting circuit 15 is a well known circuit of the charge pump type which produces a stable potential $V_{SS1}$ in response to successive clock signals CLK.

Figure 14A:
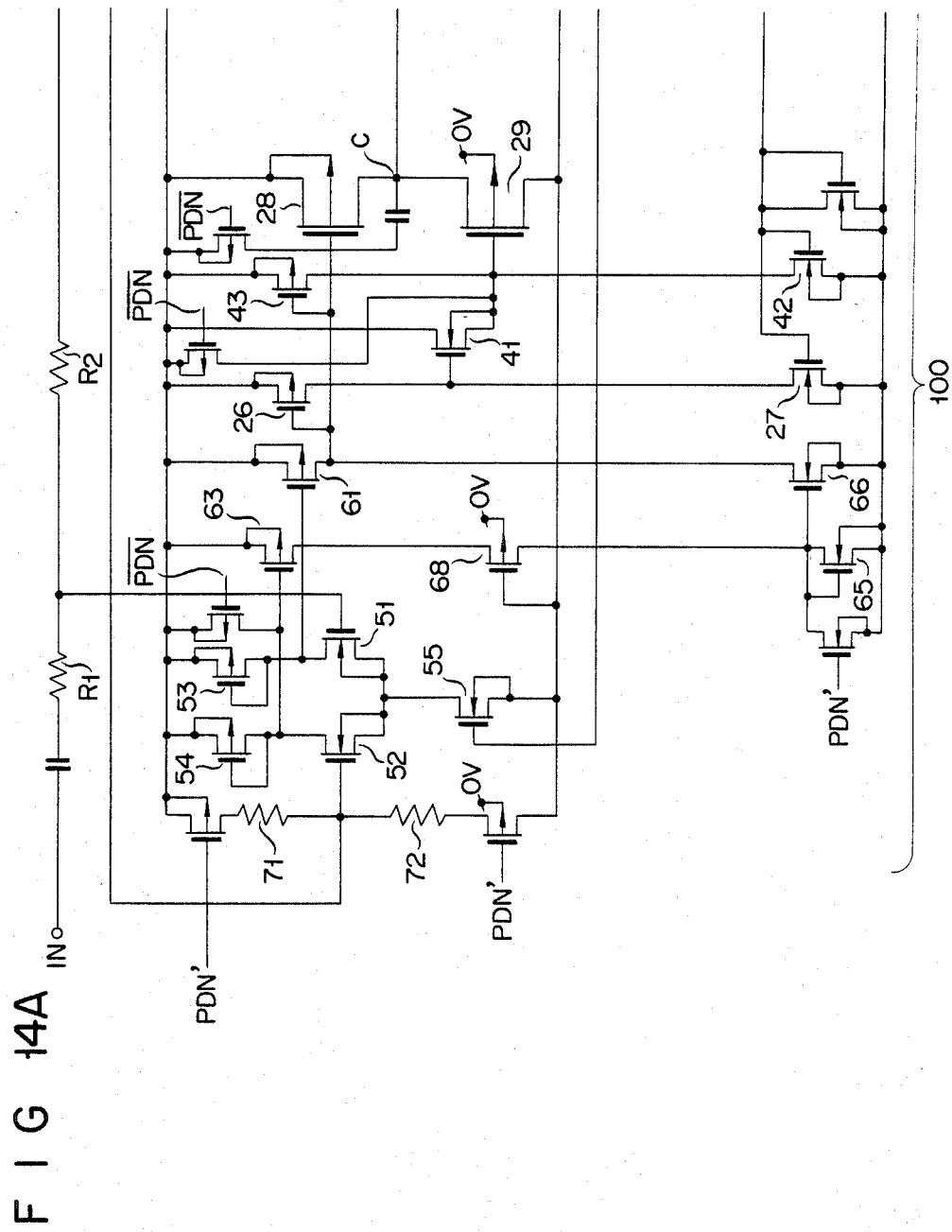
FIGS. 14A and 14B combine to form a circuit diagram of a MOS power amplifier circuit of BTL type which is formed using two MOS power amplifier circuits according to the present invention.
Figure 14B:
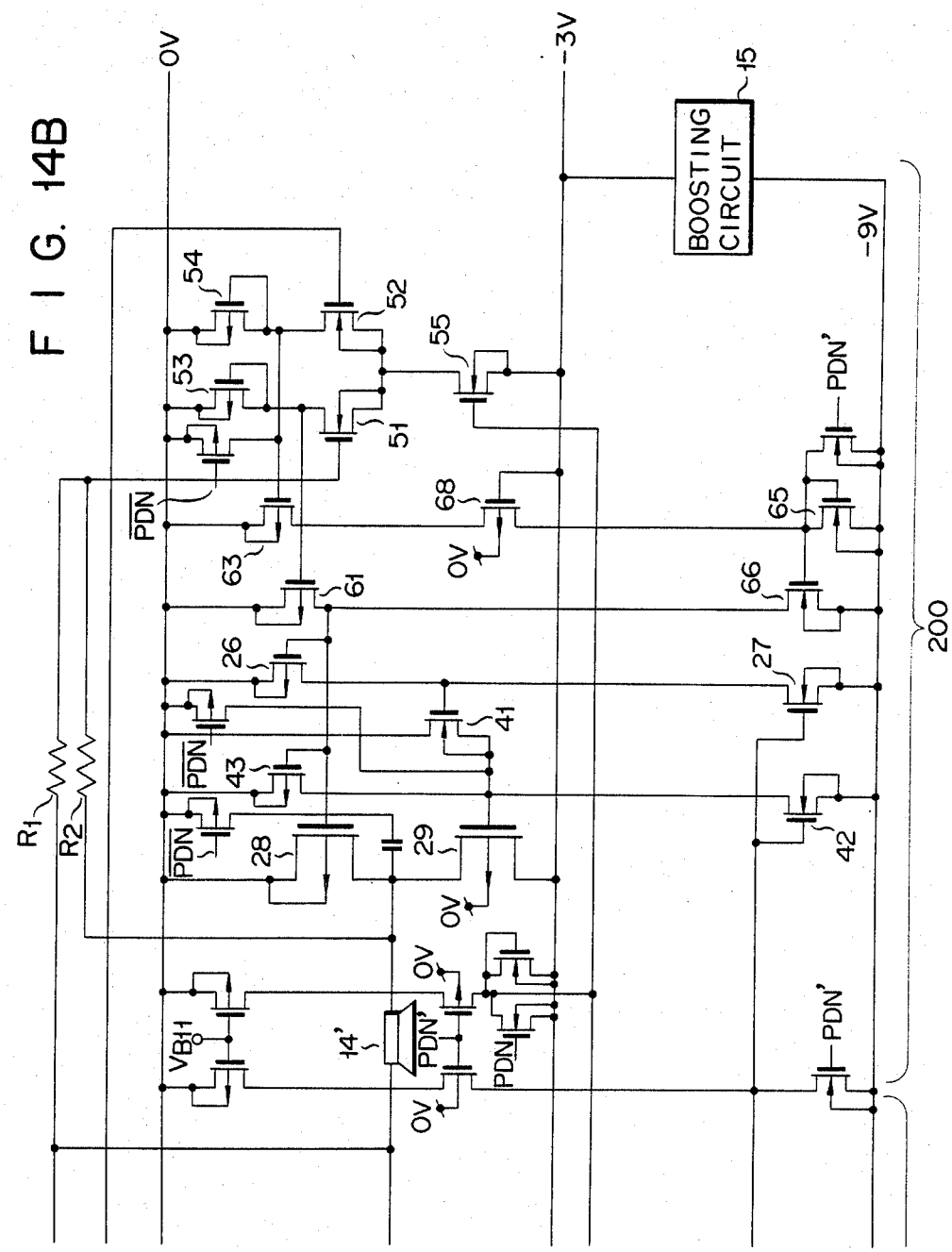

FIGS. 14A and 14B show a MOS power amplifier circuit as one of the applications of this invention. In this application, a speaker 14' is used for the load 14, and a couple of the MOS power amplifier circuits based on the embodiment shown in FIG. 12 are provided for driving the speaker 14' in a balanced transless (BTL) manner. In this application circuit, an analog input signal IN is supplied to the MOS power amplifier circuit 100 which is one of the MOS power amplifier circuits and its output is supplied to one end of the speaker 14'. The output of the MOS power amplifier circuit 100 is supplied to the other MOS power amplifier circuit 200 and its output is supplied to the other end of the speaker 14'. A block diagram of the embodiments shown in FIGS. 14A and 14B is shown in FIG. 15.

In FIGS. 14A and 14B, the gate bias potential $V_{B8}$ applied to the MOSFET 52 in the MOS power amplifier circuits 100 and 200, is set to $-1.5$ V by two resistors 71 and 72 with equal resistances connected in series between the node from which 0 V is supplied and the node from which $-3$ V is supplied. Further, in this embodiment, when no signal is input, the potential at the node c of each of the MOS power amplifier circuits 100 and 200 is set at $-1.5$ V, and therefore little current flows into the speaker 14'. When the potential of the analog input signal IN changes, the potential at the node c of each of the circuits 100 and 200 changes symmetrically with respect to $-1.5$ V, so that the speaker 14' is driven in a BTL mode. Hence, the voltage across the speaker 14' changes by at most 3 V ($=2\times1.5$ V). By driving the speaker 14' in a BTL mode, as in this application of the invention, the speaker 14' can be driven with a large output amplitude. Further, in this application, MOSFETs, which receive at the gates the power-down signals PDN, $\overline{PDN}$, PDN', are provided and turned on or off in a standby state, thereby realizing low power consumption. Of these power-down signals, the signals PDN and $\overline{PDN}$ are contained in a $-3$ V system and the signal PDN' in a $-9$ V system.

What is claimed is:
1. A MOS power amplifier circuit comprising:
a pair of nodes for receipt of a first potential difference;
a terminal for receipt of a predetermined potential;
a load;
load drive means for driving said load in response to first and second load drive means input signals, said load drive means comprising first and second MOSFETs of the same channel type connected in series between said pair of nodes, with said load being connected in series between a point of common connection between said first and second MOSFETs and said terminal for receipt of said predetermined potential;

preamplifier means for operating at a second potential difference greater than said first potential difference to amplify an analog input signal, said preamplifier means comprising a differential amplifier pair of third and fourth MOSFETs supplied at their gates with said analog input signal and with a bias potential, respectively, a fifth MOSFET connected as a current source which supplies an operating current to said third and fourth MOSFETs, and sixth and seventh MOSFETs acting as loads for said third and fourth MOSFETs, respectively;

level changing means for changing the level of an output signal from said preamplifier means to provide said first load drive means input signal to said first MOSFET of said load drive means, said level changing means comprising an eighth MOSFET and a first current path, said eighth MOSFET receiving as an input current a current flowing through said sixth MOSFET, causing a current corresponding to this input current to flow into said first current path and constituting, together with said sixth MOSFET, a first current mirror circuit; a ninth MOSFET and a second current path, said ninth MOSFET receiving as an input current a current flowing through said seventh MOSFET, causing a current corresponding to this input current to flow into said second current path and constituting, together with said seventh MOSFET, a second current mirror circuit; and a third current mirror circuit comprising tenth and eleventh MOSFETs, said third current mirror circuit receiving as an input current a current flowing through said second current path and causing a current corresponding to this input current to flow into said first current path; and inverting amplifier means, operating at said second potential difference for inverting and amplifying said first load drive means input signal from said level changing means to supply said second load drive means input signal to the gate of said second MOSFET of said load drive means.

2. A MOS power amplifier circuit according to claim 1, further including boosting means for boosting said first potential difference to form said second potential difference.

3. A MOS power amplifier circuit according to claim 1 in which said inverting amplifier means comprises a twelfth MOSFET which is supplied at its gate with said first load drive means input signal from said level changing means and a thirteenth MOSFET which is connected in series with said twelfth MOSFET to act as a load for said twelfth MOSFET.

4. A MOS power amplifier circuit comprising first and second MOS power amplifier circuits and a load, each of said first and second MOS power amplifier circuits comprising:

a pair of nodes for receipt of a first potential difference;

load drive means for driving said load in response to first and second load drive means input signals, said load drive means comprising first and second MOSFETs of the same channel type connected in series between said pair of nodes with said load being connected between a point of common connection between said first and second MOSFETs of said first MOS power amplifier circuit and a point of common connection between said first and second MOSFETs in said second MOS power amplifier circuit;

preamplifier means for operating at a second potential difference greater than said first potential difference to amplify an analog input signal, said preamplifier means comprising a differential amplifier pair of third and fourth MOSFETs supplied at their gates with said analog input signal and a bias potential, respectively, a fifth MOSFET connected as a current source which supplies an operating current to said third and fourth MOSFETs, and sixth and seventh MOSFETs acting as loads for said third and fourth MOSFETs, respectively;

level changing means for changing the level of an output signal from said preamplifier means to provide said first load drive means input signal to said first MOSFET of said load drive means, said level changing means comprising an eighth MOSFET and a first current path, said eighth MOSFET receiving as an input current a current flowing through said sixth MOSFET, causing a current corresponding to this input current to flow into said first current path and constituting, together with said sixth MOSFET, a first current mirror circuit; a ninth MOSFET and a second current path, said ninth MOSFET receiving as an input current a current flowing through said seventh MOSFET, causing a current corresponding to this input current to flow into said second current path and constituting, together with said seventh MOSFET, a second current mirror circuit; and a third current mirror circuit comprising tenth and eleventh MOSFETs, said third current mirror circuit receiving as an input current a current flowing into said second current path and causing a current corresponding to this input current to flow into said first current path;

inverting amplifier means, operating at said second potential difference, for inverting and amplifying said first load drive means input signal from said level changing means to supply said second load drive means input signal to the gate of said second MOSFET of said load drive means; and said MOS power amplifier circuit further comprising means for supplying an output signal of said first MOS amplifier circuit supplied to said load as said analog input signal of said second MOS power amplifier circuit.

* * * * *